United States Patent
Hirabayashi

(10) Patent No.: US 9,899,374 B2
(45) Date of Patent: Feb. 20, 2018

(54) SEMICONDUCTOR DEVICE

(71) Applicant: TOYOTA JIDOSHA KABUSHIKI KAISHA, Toyota-shi, Aichi-ken (JP)

(72) Inventor: Yasuhiro Hirabayashi, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 15/354,240

(22) Filed: Nov. 17, 2016

(65) Prior Publication Data

US 2017/0148785 A1     May 25, 2017

(30) Foreign Application Priority Data

Nov. 19, 2015  (JP) ................. 2015-227049

(51) Int. Cl.
| | |
|---|---|
| H01L 27/06 | (2006.01) |
| H01L 29/739 | (2006.01) |
| H01L 29/06 | (2006.01) |
| H01L 29/423 | (2006.01) |

(52) U.S. Cl.
CPC ...... H01L 27/0635 (2013.01); H01L 29/0696 (2013.01); H01L 29/423 (2013.01); H01L 29/4238 (2013.01); H01L 29/7391 (2013.01); H01L 29/7397 (2013.01)

(58) Field of Classification Search
CPC .......... H01L 29/7397; H01L 29/7302; H01L 29/7391
See application file for complete search history.

(56) References Cited

U.S. PATENT DOCUMENTS

| | | |
|---|---|---|
| 2013/0087829 A1 | 4/2013 | Tanabe et al. |
| 2014/0231867 A1 | 8/2014 | Yamashita et al. |
| 2014/0361333 A1 | 12/2014 | Kimura et al. |
| 2015/0214217 A1 | 7/2015 | Hosokawa et al. |

FOREIGN PATENT DOCUMENTS

| | | |
|---|---|---|
| JP | 2012-033897 A | 2/2012 |
| JP | 2013-021104 A | 1/2013 |
| JP | 2013-152996 A | 8/2013 |
| JP | 2014-157930 A | 8/2014 |
| JP | 2015-141935 A | 8/2015 |

*Primary Examiner* — Daniel Luke

(57) ABSTRACT

A semiconductor device includes a semiconductor substrate including, on a first surface, first trenches and a second trench linked to each of the first trenches. The semiconductor substrate includes: a p-type end layer extending from the first surface to a position closer to a second surface of the semiconductor substrate than an end of each of the first trenches on a second surface side and including a longitudinal end of each of the first trenches in a plan view of the first surface; a first p-type layer provided in a region between adjacent first trenches, and contacting the first electrode provided on the first surface; an n-type barrier layer; a second p-type layer. The second trench separates the p-type end layer from the first p-type layer and the second p-type layer.

18 Claims, 13 Drawing Sheets

SEMICONDUCTOR DEVICE

INCORPORATION BY REFERENCE

The disclosure of Japanese Patent Application No. 2015-227049 filed on Nov. 19, 2015 including the specification, drawings and abstract is incorporated herein by reference in its entirety.

BACKGROUND OF THE DISCLOSURE

1. Field of the Disclosure

The present disclosure relates to a semiconductor device.

2. Description of Related Art

A diode is disclosed in Japanese Patent Application Publication No. 2015-141935 (JP 2015-141935 A). Trenches are formed on an upper surface of a semiconductor substrate. An inner surface of each of the trenches is covered with an insulation layer. An electrode is disposed in each of the trenches. Each of the trenches penetrates p-type anode layer (body layer) and reaches an n-type drift layer. The p-type anode layer of this diode is vertically divided by an n-type barrier layer. The n-type drift layer is disposed below the lower anode layer. An n-type cathode layer is disposed on a lower side of the n-type drift layer.

When a forward voltage is applied to this diode, holes flow from the upper anode layer to the n-type cathode layer via the n-type barrier layer, the lower anode layer, and the n-type drift layer. Meanwhile, electrons flow in a direction opposite from the flow of the holes. When the forward voltage is applied to the diode, a p-n junction as an interface between the n-type barrier layer and the lower anode layer becomes a barrier against the holes. Accordingly, the holes are suppressed from flowing into the n-type drift layer from the upper anode layer via the n-type barrier layer and the lower anode layer. When the applied voltage to the diode is switched from the forward voltage to a reverse voltage thereafter, the holes existing in the n-type drift layer are discharged to an anode electrode via the lower anode layer, the n-type barrier layer, and the upper anode layer. A reverse current (a so-called reverse recovery current) thereby flows through the diode. With a flow of the reverse recovery current, loss (so-called reverse recovery loss) occurs to the diode. However, because the holes are suppressed from flowing into the n-type drift layer during application of the forward voltage, a small number of holes are discharged from the n-type drift layer to the anode electrode during application of the reverse voltage. Thus, the reverse recovery loss is suppressed in this diode.

SUMMARY

When the reverse voltage is applied to the diode, a depletion layer expands within the n-type drift layer, and an electric field is generated in the n-type drift layer. In the diode that has the trenches as in JP 2015-141935 A, the electric field is likely to be concentrated near a longitudinal end of each of the trenches. In order to suppress such concentration of the electric field, there is a case where a p-type layer is provided in a manner to surround the longitudinal end of each of the trenches (hereinafter referred to as a p-type end layer). However, in the case where the p-type end layer is provided in the diode, in which the upper anode layer and the lower anode layer are divided by the n-type barrier layer as in JP 2015-141935 A, the upper anode layer and the lower anode layer are connected by the p-type end layer. In this case, when the forward voltage is applied to the diode, a potential of the lower anode layer becomes substantially the same as that of the upper anode layer, and the holes flow into the n-type drift layer from the lower anode layer. As a result, an above-described effect of suppressing the reverse recovery loss is decreased. The disclosure provides a technique of effectively suppressing reverse recovery loss in a diode that has both a barrier layer and a p-type end layer.

A semiconductor device according to an aspect of the disclosure includes: a semiconductor substrate that includes, on a first surface, a plurality of first trenches and a second trench linked to each of the first trenches; first insulating layers covering an inner surface of each of the first trenches; first trench electrodes respectively provided in the first trenches and insulted from the semiconductor substrate by the first insulating layers; a second insulating layer covering an inner surface of the second trench; a first electrode provided on the first surface; and a second electrode provided on a second surface of the semiconductor substrate. The semiconductor substrate includes: a p-type end layer extending from the first surface to a position closer to the second surface than an end of each of the first trenches on a second surface side in a thickness direction of the semiconductor substrate and including a longitudinal end of each of the first trenches in a plan view of the first surface; a first p-type layer provided on an opposite side of the p-type end layer across the second trench, the first p-type layer being provided in an inter-trench region that is held between adjacent first trenches, and contacting the first electrode; an n-type barrier layer, the n-type barrier layer being provided in the inter-trench region and being provided closer to the second surface than the first p-type layer; a second p-type layer provided in the inter-trench region, the second p-type layer being provided closer to the second surface than the n-type barrier layer, and being separated from the first p-type layer by the n-type barrier layer; an n-type drift layer, the n-type drift layer being provided closer to the second surface than the second p-type layer; and an n-type cathode layer, the n-type cathode layer being provided closer to the second surface than the n-type drift layer and contacting the n-type drift layer and the second electrode. The second trench separates the p-type end layer from the first p-type layer and the second p-type layer.

In this semiconductor device, a first p-type layer functions as an upper anode layer, and a second p-type layer functions as a lower anode layer. In addition, the upper electrode functions as an anode electrode, and the lower electrode functions as a cathode electrode. That is, the upper electrode, the upper anode layer, the n-type barrier layer, the lower anode layer, the n-type drift layer, the n-type cathode layer, and the lower electrode constitute a diode (a diode in which the p-type anode layers are vertically separated by the n-type barrier layer).

In this semiconductor, the longitudinal end of the first trench is surrounded by the p-type end layer. Thus, when a reverse voltage is applied to the diode, concentration of an electric field in a periphery of the longitudinal end of the first trench is suppressed. In addition, in this semiconductor device, the p-type end layer is separated from the p-type layer and the second p-type layer by the second trench. That is, the second p-type layer is separated from the first p-type layer. Thus, when a forward voltage is applied to the diode, a potential of the second p-type layer becomes lower than a potential of the first p-type layer, and inflow of holes from the second p-type layer into the n-type drift layer is suppressed. For this reason, the number of the holes that exist in the drift layer during application of the forward voltage is small. Therefore, when the applied voltage of the diode is switched from the forward voltage to the reverse voltage, reverse recovery loss is effectively suppressed.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
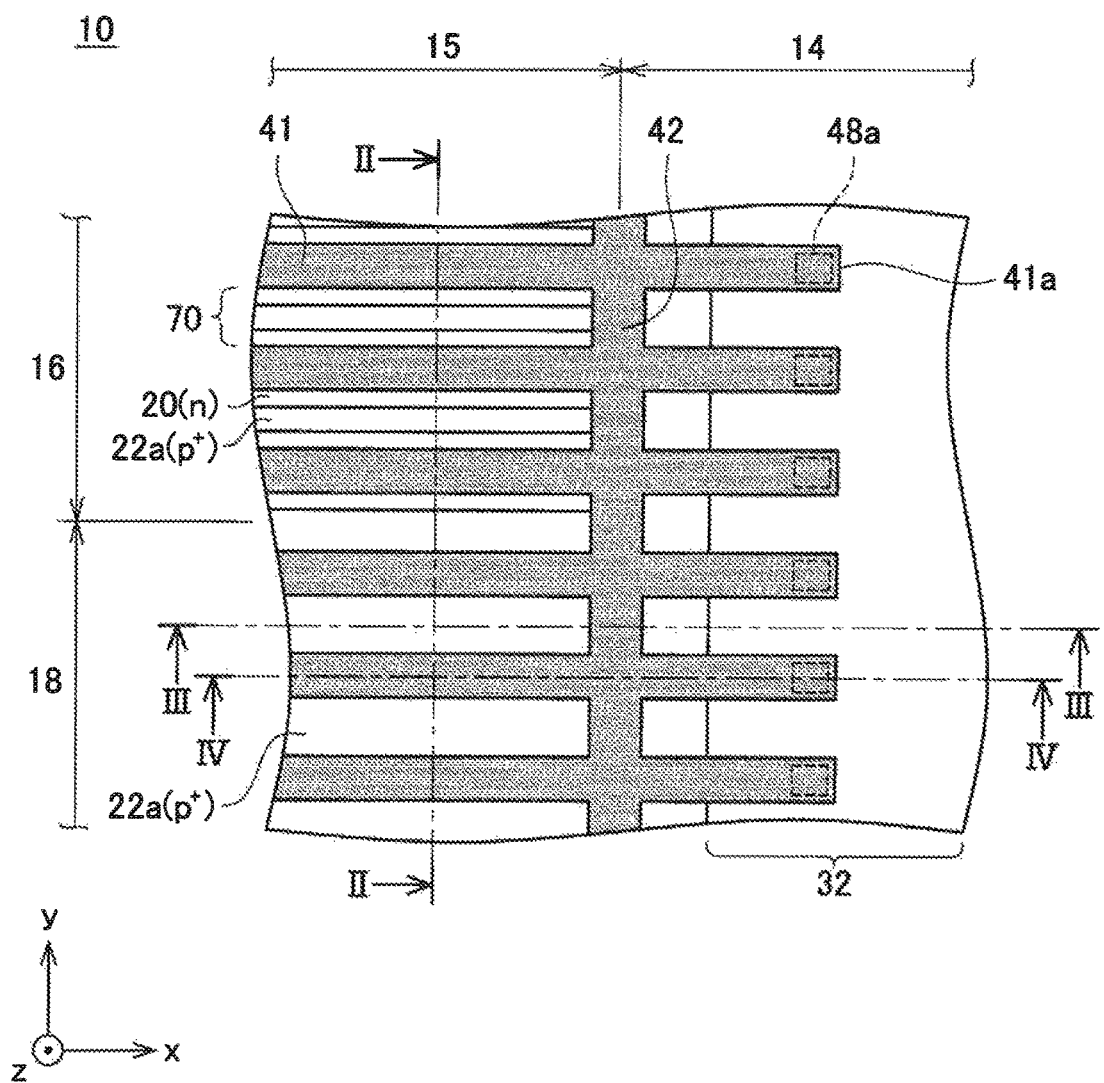
FIG. 1 is a plan view of a semiconductor device 10.

FIGS. 1 to 4 show a semiconductor device 10 of an example. The semiconductor device 10 has a semiconductor substrate 12 as well as electrodes, insulating films, and the like that are arranged on an upper surface 12a and a lower surface 12b of the semiconductor substrate 12. Note that the electrodes and the insulating layers on the semiconductor substrate 12 are not shown in FIG. 1 to promote understanding of the drawing. In addition, a first trench 41 and a second trench 42 are hatched in FIG. 1 to promote the visibility of the drawing. In the following description, a direction that is parallel to the upper surface 12a of the semiconductor substrate 12 is referred to as an x-direction, a direction that is parallel to the upper surface 12a of the semiconductor substrate 12 and is orthogonal to the x-direction is referred to as a y-direction, and a thickness direction of the semiconductor substrate 12 is referred to as a z-direction.

Figure 2:
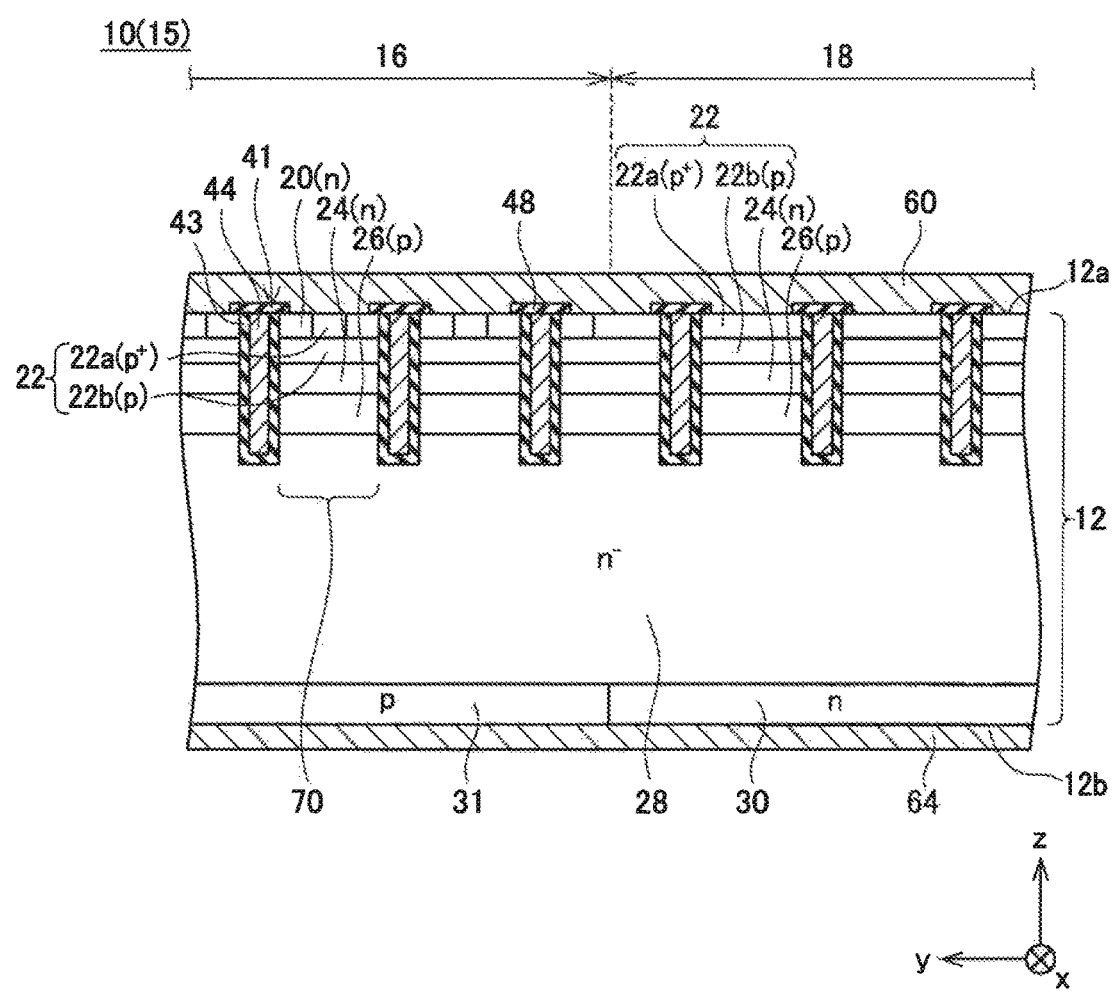
FIG. 2 is a vertical cross-sectional view that is taken along II-II in FIG. 1.
Figure 3:
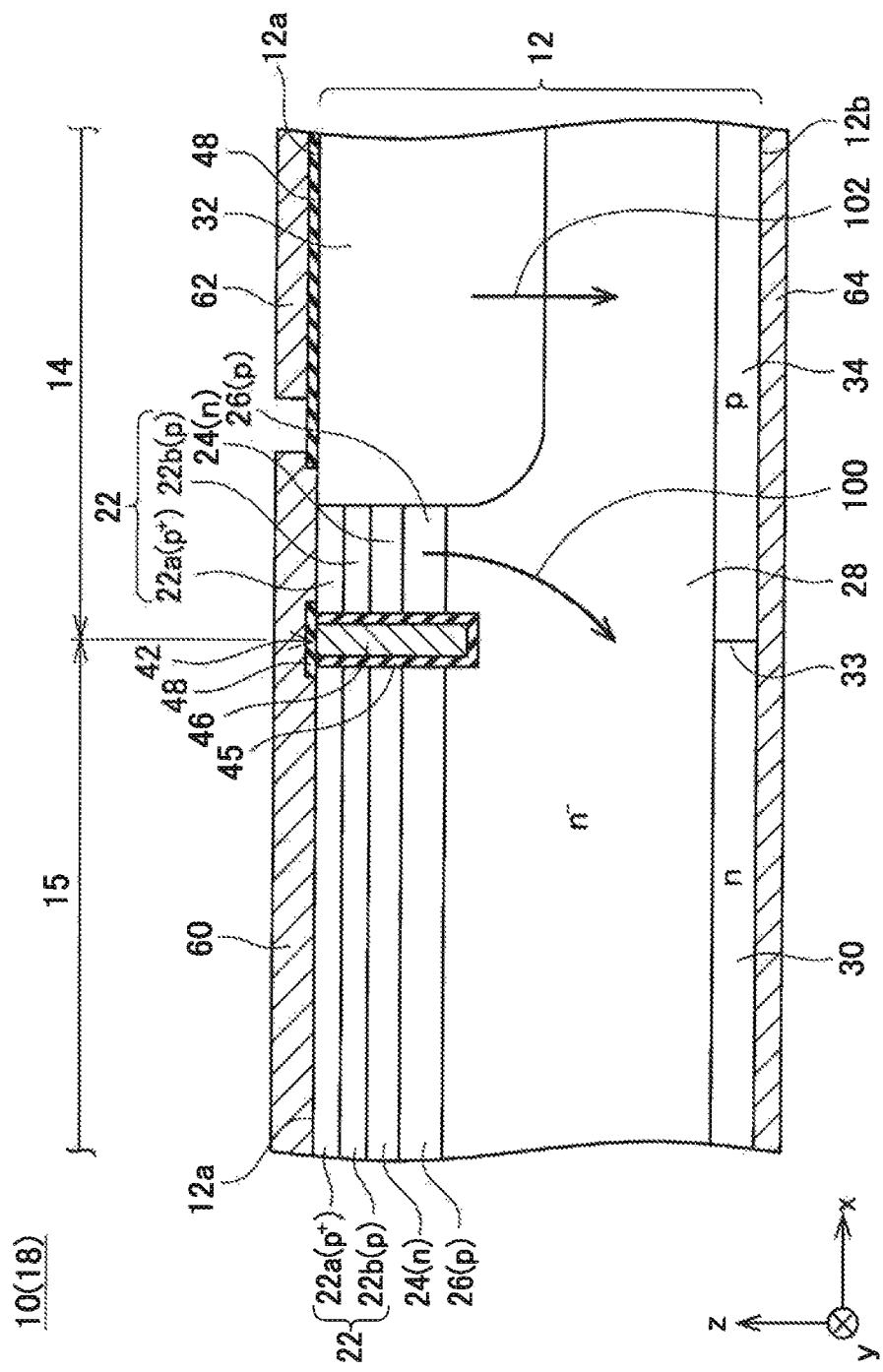
FIG. 3 is a vertical cross-sectional view that is taken along III-III in FIG. 1.
Figure 4:
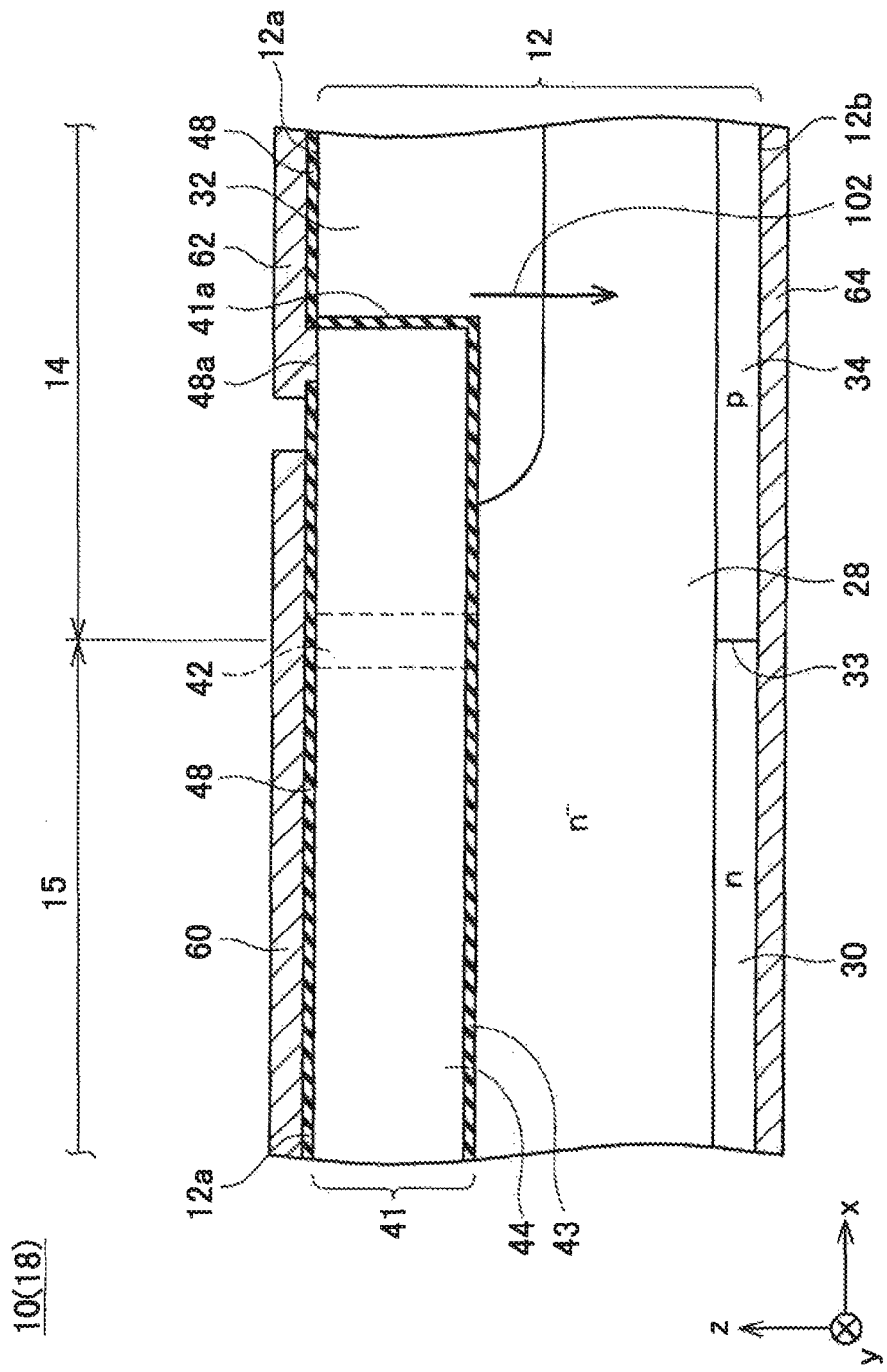
FIG. 4 is a vertical cross-sectional view that is taken along IV-IV in FIG. 1.

As shown in FIGS. 2 to 4, an upper electrode 60 and a gate line 62 are arranged on the upper surface 12a of the semiconductor substrate 12. The gate line 62 is separated from the upper electrode 60. A lower electrode 64 is arranged on the lower surface 12b of the semiconductor substrate 12.

The semiconductor substrate 12 is constructed of silicon. As shown in FIG. 1, the plural first trenches 41 and the second trench 42 are formed in the upper surface 12a of the semiconductor substrate 12. When the upper surface 12a of the semiconductor substrate 12 is seen in a plan view, each of the first trenches 41 extends linearly in the x-direction, and the second trench 42 extends linearly in the y-direction. The plural first trenches 41 extend parallel to each other in the upper surface 12a. When the upper surface 12a is seen in the plan view, the second trench 42 crosses each of the first trenches 41. In other words, the second trench 42 is linked to each of the first trenches 41. As shown in FIGS. 2 to 4, the first trenches 41 and the second trench 42 have substantially the same depth. As shown in FIG. 4, each of the first trenches 41 extends from a lower side of the upper electrode 60 to a lower side of the gate line 62. An end 41a of each of the first trenches 41 in the x-direction is arranged on the lower side of the gate line 62.

As shown in FIGS. 2 to 4, an inner surface of each of the first trenches 41 is covered with an insulating layer 43. A trench electrode 44 is arranged in each of the first trenches 41. An inner surface of the second trench 42 is covered with an insulating layer 45. The insulating layer 45 is joined to the insulating layer 43 in a connected section of the first trench 41 and the second trench 42. A trench electrode 46 is arranged in the second trench 42. The trench electrode 46 is linked to the trench electrode 44 in the connected section of the first trench 41 and the second trench 42. The trench electrodes 44, 46 are insulated from the semiconductor substrate 12 by the insulating layers 43, 45. An upper surface of each of the trench electrodes 44, 46 is covered with an interlayer insulating film 48. The trench electrodes 44, 46 are each insulated from the upper electrode 60 by the interlayer insulating film 48. The interlayer insulating film 48 is also arranged between the semiconductor substrate 12 and the gate line 62. The gate line 62 is insulated from the semiconductor substrate 12 by the interlayer insulating film 48. As shown in FIGS. 1, 4, a contact hole 48a is formed in the interlayer insulating film 48 that is located on the end 41a of the first trench 41. The trench electrode 44 is connected to the gate line 62 via the contact hole 48a.

When the upper surface 12a of the semiconductor substrate 12 is seen in the plan view as shown in FIG. 1, a region of the ends 41a of the first trenches 41 rather than a region of the second trench 42 is a peripheral region 14, through which a current does not flow significantly during energization of the semiconductor device 10. In addition, when the upper surface 12a of the semiconductor substrate 12 is seen in the plan view, a region on an opposite side of the peripheral region 14 from the second trench 42 is an element region 15, through which a primary current flows during the energization of the semiconductor device 10. The element region 15 includes: an IGBT region 16 where an insulated gate bipolar transistor (IGBT) is formed; and a diode region 18 where a diode is formed. In other words, the semiconductor device 10 is a reverse conducting-IGBT (RC-IGBT).

As shown in FIGS. 1, 2, the plural first trenches 41 are arranged in the IGBT region 16, and the plural first trenches 41 are also arranged in the diode region 18. In the following description, a region (that is, semiconductor layers) that is interposed between the two first trenches 41 is referred to as an inter-trench region 70. The plural inter-trench regions 70 are arranged in the IGBT region 16, and the plural inter-trench regions 70 are also arranged in the diode region 18.

As shown in FIG. 2, the semiconductor substrate 12 has an emitter layer 20, an upper body layer 22, a barrier layer 24, a lower body layer 26, a drift layer 28, a first collector layer 31, and a cathode layer 30 in the element region 15. Note that, as shown in FIG. 2, the diode region 18 may be regarded as a region that has the cathode layer 30 between the drift layer 28 and the lower electrode 64 and the IGBT region 16 may be regarded as a region that has the collector layer 31 between the drift layer 28 and the lower electrode 64.

The emitter layer 20 is not arranged in the diode region 18 but is arranged in the IGBT region 16. The emitter layer 20 is arranged in the inter-trench region 70. In other words, a range where the inter-trench region 70 including the emitter layer 20 exists is the IGBT region 16, and a range where the inter-trench region 70 not including the emitter layer 20 exists is the diode region 18. The emitter layer 20 is an n-type layer. The emitter layer 20 is arranged in a range that is exposed to the upper surface 12a of the semiconductor substrate 12. The emitter layer 20 is in ohmic contact with the upper electrode 60. The emitter layer 20 contacts the insulating layer 43. As shown in FIG. 1, the emitter layer 20 extends long along the first trench 41 in the x-direction.

As shown in FIG. 2, the upper body layer 22 is distributed across the IGBT region 16 and the diode region 18. The upper body layer 22 is a p-type layer. The upper body layer 22 has a high-concentration layer 22a and a low-concentration layer 22b. P-type impurity concentration of the high-concentration layer 22a is higher than the p-type impurity concentration of the low-concentration layer 22b. The high-concentration layer 22a is arranged in a range that is exposed to the upper surface 12a of the semiconductor substrate 12. In the diode region 18, the high-concentration layer 22a contacts the upper electrode 60 in an entire range of the upper surface 12a in the inter-trench region 70. In the IGBT region 16, the high-concentration layer 22a contacts the upper electrode 60 in a range that is interposed between the two emitter layers 20. The high-concentration layer 22a is in ohmic contact with the upper electrode 60. The low-concentration layer 22b is arranged below the high-concentration layer 22a. In the diode region 18, the low-concentration layer 22b contacts the high-concentration layer 22a from below. In the IGBT region 16, the low-concentration layer 22b contacts the emitter layer 20 and the high-concentration layer 22a from below. The low-concentration layer 22b contacts the insulating layer 43 in the IGBT region 16 and the diode region 18.

The barrier layer 24 is distributed across the IGBT region 16 and the diode region 18. The barrier layer 24 is the n-type layer. The barrier layer 24 contacts the low-concentration layer 22b from below in the IGBT region 16 and the diode region 18. The barrier layer 24 contacts the insulating layer 43 in the IGBT region 16 and the diode region 18. The barrier layer 24 is separated from the emitter layer 20 by the upper body layer 22.

The lower body layer 26 is distributed across the IGBT region 16 and the diode region 18. The lower body layer 26 is the p-type layer. The lower body layer 26 contacts the barrier layer 24 from below in the IGBT region 16 and the diode region 18. The lower body layer 26 contacts the insulating layer 43 in the IGBT region 16 and the diode region 18. The lower body layer 26 is separated from the upper body layer 22 by the barrier layer 24.

The drift layer 28 is distributed across the IGBT region 16 and the diode region 18. The drift layer 28 is the n-type layer. N-type impurity concentration of the drift layer 28 is lower than any of the n-type impurity concentration of the emitter layer 20, the p-type impurity concentration of the low-concentration layer 22b, the n-type impurity concentration of the barrier layer 24, and the p-type impurity concentration of the lower body layer 26. The drift layer 28 contacts the lower body layer 26 from below. The drift layer 28 is separated from the barrier layer 24 by the lower body layer 26. The drift layer 28 is distributed to a portion below a lower end of each of the first trenches 41 and a lower end of the second trench 42.

As it has been described so far, in the IGBT region 16 and the diode region 18, the upper body layer 22, the barrier layer 24, and the lower body layer 26 are arranged in the inter-trench region 70. In other words, each of the first trenches 41 penetrates the upper body layer 22, the barrier layer 24, and the lower body layer 26 and reaches the drift layer 28. The trench electrode 44 in the IGBT region 16 opposes the emitter layer 20, the upper body layer 22, the barrier layer 24, the lower body layer 26, and the drift layer 28 via the insulating layer 43. The trench electrode 44 in the IGBT region 16 functions as a gate electrode for switching the IGBT.

The first collector layer 31 contacts the drift layer 28 from below in the IGBT region 16. The first collector layer 31 is arranged in a range that is exposed to the lower surface 12b in the IGBT region 16. The first collector layer 31 is the p-type layer. The first collector layer 31 is in ohmic contact with the lower electrode 64.

The cathode layer 30 contacts the drift layer 28 from below in the diode region 18. The cathode layer 30 is arranged in a range that is exposed to the lower surface 12b in the diode region 18. The cathode layer 30 is the n-type layer. The cathode layer 30 is in ohmic contact with the lower electrode 64. The n-type impurity concentration of the cathode layer 30 is higher than the n-type impurity concentration of the drift layer 28.

As shown in FIG. 3, the upper body layer 22, the barrier layer 24, and the lower body layer 26 are also arranged in the vicinity of the second trench 42 in the peripheral region 14. In addition, as shown in FIGS. 3, 4, the drift layer 28 extends from the element region 15 (that is, the IGBT region 16 and the diode region 18) to the peripheral region 14. The semiconductor substrate 12 has a p-type end layer 32 and a second collector layer 34 in the peripheral region 14.

The p-type impurity concentration of the p-type end layer 32 is higher than the n-type impurity concentration of the drift layer 28. In addition, the p-type impurity concentration of the p-type end layer 32 is higher than either of the p-type impurity concentration of the low-concentration layer 22b and the p-type impurity concentration of the lower body layer 26. The p-type end layer 32 extends from the upper surface 12a of the semiconductor substrate 12 to a position that is deeper than the lower ends of the first trench 41 and the second trench 42. As shown in FIG. 4, the p-type end layer 32 is arranged in a manner to be inclusive of the end 41a of the first trench 41 in the x-direction. The p-type end layer 32 contacts an entire range of a lateral surface of the first trench 41 in the z-direction at the end 41a. The p-type end layer 32 also contacts a bottom surface of the first trench 41 at the end 41a. The drift layer 28 is arranged below the p-type end layer 32. The drift layer 28 contacts the p-type end layer 32 from below.

As shown in FIGS. 3, 4, the second collector layer 34 contacts the drift layer 28 from below in the peripheral region 14. The second collector layer 34 is arranged in a range that is exposed to the lower surface 12b in the peripheral region 14. The second collector layer 34 is the p-type layer. The second collector layer 34 is in ohmic contact with the lower electrode 64. The second collector layer 34 is adjacent to the cathode layer 30. An interface 33 between the cathode layer 30 and the second collector layer 34 is arranged below the second trench 42.

As shown in FIG. 3, the p-type end layer 32 is separated from the upper body layer 22 and the lower body layer 26 in the element region 15 (that is, the IGBT region 16 and the diode region 18) by the second trench 42. In this way, the upper body layer 22 and the lower body layer 26 in the element region 15 are separated from each other. In other words, when the second trench 42 does not exist, the upper body layer 22 and the lower body layer 26 in the element region 15 are connected to each other via the p-type end layer 32. On the contrary, when the second trench 42 exists, the upper body layer 22 and the lower body layer 26 in the element region 15 are separated from the p-type end layer 32, and thus the upper body layer 22 and the lower body layer 26 in the element region 15 are separated from each other. In addition, although not shown, an end of each of the first trenches 41 that is located opposite to the end 41a has the same structure as that shown in FIGS. 1, 3, and 4. That is, when seen from above in the plan view, each of the inter-trench regions 70 is surrounded by the first trenches 41 and the second trench 42. Thus, the upper body layer 22 is completely separated from the lower body layer 26 in each of the inter-trench regions 70.

Next, an operation of the semiconductor device 10 will be described. First, an operation of the IGBT will be described. When the semiconductor device 10 is operated as the IGBT, a higher potential is applied to the lower electrode 64 than that to the upper electrode 60. In addition, a potential of each of the trench electrodes 44 is controlled by the gate line 62. When the potential that is at least equal to a threshold is applied to each of the trench electrodes 44, channels are formed in the upper body layer 22 and the lower body layer 26 in the IGBT region 16. The channels are formed in a range that is adjacent to the insulating layer 43. Once the channels are formed, electrons flow from the upper electrode 60 to the lower electrode 64 via the emitter layer 20, the channel of the upper body layer 22, the barrier layer 24, the channel of the lower body layer 26, the drift layer 28, and the first collector layer 31. At the same time, holes flow from the lower electrode 64 to the upper electrode 60 via the first collector layer 31, the drift layer 28, the lower body layer 26, the barrier layer 24, the low-concentration layer 22b, and the high-concentration layer 22a. At this time, a p-n junction on an interface between the barrier layer 24 and the low-concentration layer 22b interrupts the flow of the holes. Thus, the holes are suppressed from flowing to the upper electrode 60. As a result, concentration of the holes in the drift layer 28 is increased, which lowers resistance of the drift layer 28. Thus, loss of the semiconductor device 10 that is generated while the IGBT is on is small.

When the potential of the trench electrodes 44 is lowered below the threshold, the channels disappear, and the IGBT is turned off. Once the IGBT is turned off, a depletion layer expands from a p-n junction on an interface between the lower body layer 26 and the drift layer 28 into the drift layer 28. As a result, almost entire drift layer 28 is depleted. An electric field is generated in the depletion layer. When the p-type end layer 32 does not exist, the depletion layer reaches the end 41a of the first trench 41, and the electric field is concentrated around the end 41a. On the contrary, the p-type end layer 32 is inclusive of the end 41a of the first trench 41 in the semiconductor device 10 of this example. The depletion layer is unlikely to expand from the n-type drift layer 28 to the p-type end layer 32. In particular, because the p-type impurity concentration of the p-type end layer 32 is higher than the n-type impurity concentration of the drift layer 28, the depletion layer is unlikely to expand into the p-type end layer 32. In this example, because the p-type impurity concentration of the p-type end layer 32 is higher than the p-type impurity concentration of the low-concentration layer 22b and the p-type impurity concentration of the lower body layer 26, the depletion layer hardly expands into the p-type end layer 32. Accordingly, the semiconductor layer around the end 41a of the first trench 41 is not depleted, and the high electric field is not generated around the end 41a. For this reason, the IGBT has a high withstand voltage.

Next, an operation of the diode will be described. When the higher potential is applied to the upper electrode 60 than that to the lower electrode 64, the diode is turned on. That is, the electrons flow from the lower electrode 64 to the upper electrode 60 via the cathode layer 30, the drift layer 28, the lower body layer 26, the barrier layer 24, the low-concentration layer 22b, and the high-concentration layer 22a. In addition, the holes flow from the upper electrode 60 to the lower electrode 64 via the high-concentration layer 22a, the low-concentration layer 22b, the barrier layer 24, the lower body layer 26, the drift layer 28, and the cathode layer 30. Accordingly, the current flows from the upper electrode 60 to the lower electrode 64. At this time, the p-n junction on the interface between the barrier layer 24 and the lower body layer 26 interrupts the flow of the holes. Thus, inflow of the holes into the drift layer 28 is suppressed. As a result, the concentration of the holes in the drift layer 28 is lowered.

In particular, in this example, the upper body layer 22 and the lower body layer 26 are completely separated, and the potential of the lower body layer 26 is independent from the potential of the upper body layer 22. Thus, when the diode is turned on, the potential of the lower body layer 26 becomes lower than the potential of the upper body layer 22, and a voltage that is applied to the p-n junction on the interface between the lower body layer 26 and the drift layer 28 becomes low. Therefore, the inflow of the holes into the drift layer 28 can effectively be suppressed. Therefore, the concentration of the holes in the drift layer 28 is particularly low while the diode is on.

Note that, as shown in FIG. 3, a laminated layer structure of the upper body layer 22, the barrier layer 24, and the lower body layer 26 is also formed in a region in the vicinity of the second trench 42 in the peripheral region 14. In the peripheral region 14, the upper body layer 22 is linked to the lower body layer 26 via the p-type end layer 32. Thus, when the diode is turned on, the potential of the lower body layer 26 becomes substantially equal to the potential of the upper body layer 22 in the peripheral region 14. As a result, as indicated by an arrow 100 in FIG. 3, the holes are likely to flow from the lower body layer 26 into the drift layer 28 in the peripheral region 14. However, an area (an area that is seen from the above in the plan view) of the lower body layer 26 formed in the peripheral region 14 is significantly smaller than an area of the lower body layer 26 formed in the element region 15. Therefore, the inflow of the holes, which is indicated by the arrow 100, has a small influence even when being generated. With provision of the second trench 42, a significant portion of the lower body layer 26 (the lower body layer 26 of the element region 15) is completely separated from the upper body layer 22, and in this way, the inflow of the holes into the drift layer 28 can effectively be suppressed.

In addition, as shown in FIGS. 3, 4, not the n-type cathode layer 30 but the p-type second collector layer 34 is arranged below the p-type end layer 32. When the n-type cathode layer 30 is arranged below the p-type end layer 32, the holes are likely to flow from the p-type end layer 32 into the cathode layer 30 via the drift layer 28. That is, the holes are likely to flow from the p-type end layer 32 into the drift layer 28. On the contrary, when the p-type second collector layer 34 is arranged below the p-type end layer 32 as in this example, the inflow of the holes from the p-type end layer 32 into the drift layer 28, which is indicated by an arrow 102 in FIG. 3, can be suppressed.

When the potential of the upper electrode 60 becomes lower than the potential of the lower electrode 64 after turning on the diode, the diode performs a reverse recovery operation. In other words, the holes that exist in the drift layer 28 while the diode is on are discharged to the upper electrode 60 via the lower body layer 26, the barrier layer 24, the low-concentration layer 22b, and the high-concentration layer 22a. This momentarily causes a large reverse current (a reverse recovery current) to flow through the diode. However, as described above, because the inflow of the holes into the drift layer 28 is suppressed during turning on the diode (that is, the number of the holes existing in the drift layer 28 is small) in the semiconductor device 10 of this example, the number of the holes that are discharged from the drift layer 28 to the upper electrode 60 in the reverse recovery operation is small. Therefore, in the semiconductor device 10 of this example, the reverse recovery current is suppressed, and reverse recovery loss is suppressed.

As described so far, in the semiconductor device 10 of this example, the p-type end layer 32 suppresses the concentration of the electric field around the end 41a of the first trench 41. Thus, the withstand voltage during the operation of the IGBT is improved. In addition, in the semiconductor device 10 of this example, the upper body layer 22 and the lower body layer 26 in the element region 15 are separated from the p-type end layer 32 by the second trench 42. Accordingly, the lower body layer 26 is separated from the upper body layer 22 in the element region 15. Thus, the inflow of the holes into the drift layer 28 is suppressed when the diode is on. Therefore, the reverse recovery current is suppressed, and the reverse recovery loss is suppressed during the reverse recovery operation of the diode.

In the semiconductor device 10 of this example, the first trenches 41 (that is, the trench electrodes 44) are provided not only in the IGBT region 16 but also in the diode region 18. Thus, when the IGBT is off, the electric field is unlikely to be disturbed in a boundary section between the IGBT region 16 and the diode region 18. This also realizes the high withstand voltage.

Figure 5:
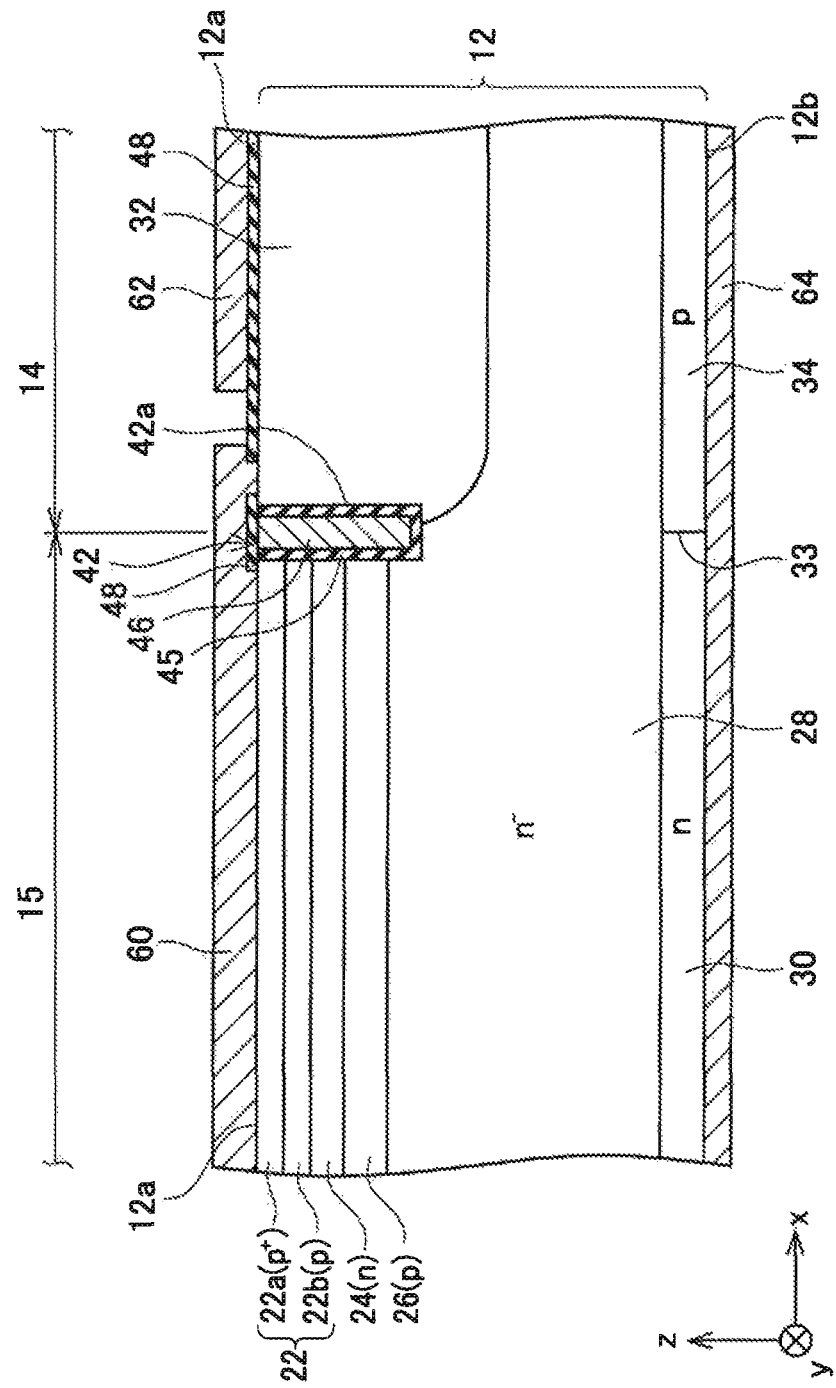
FIG. 5 is a vertical cross-sectional view of a semiconductor device in a first modified example that corresponds to FIG. 3.

Modified examples of the above-described example will hereinafter be described. In the above-described example, as shown in FIG. 3, the upper body layer 22, the barrier layer 24, and the lower body layer 26 are provided between the second trench 42 and the p-type end layer 32. However, as shown in FIG. 5 as a first modified example, the p-type end layer 32 may contact a lateral surface 42a (a lateral surface 42a on the p-type end layer 32 side) of the second trench 42. For example, the p-type end layer 32 may contact an entire range of the lateral surface 42a. With such a configuration, the flow of the holes as indicated by the arrow 100 in FIG. 3 can be eliminated. In this way, the reverse recovery loss of the diode can further be suppressed.

Figure 6:
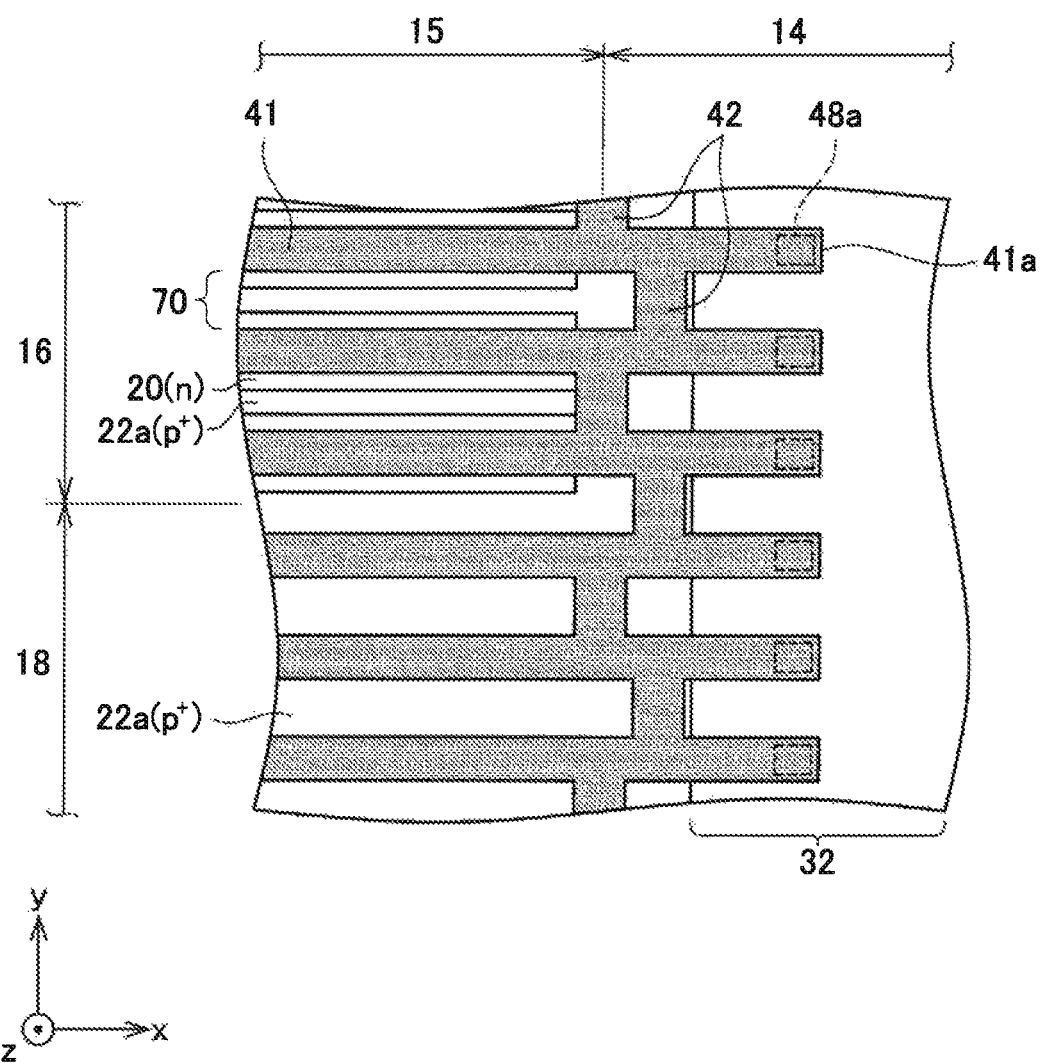
FIG. 6 is a plan view of a semiconductor device in a second modified example that corresponds to FIG. 1.
Figure 7:
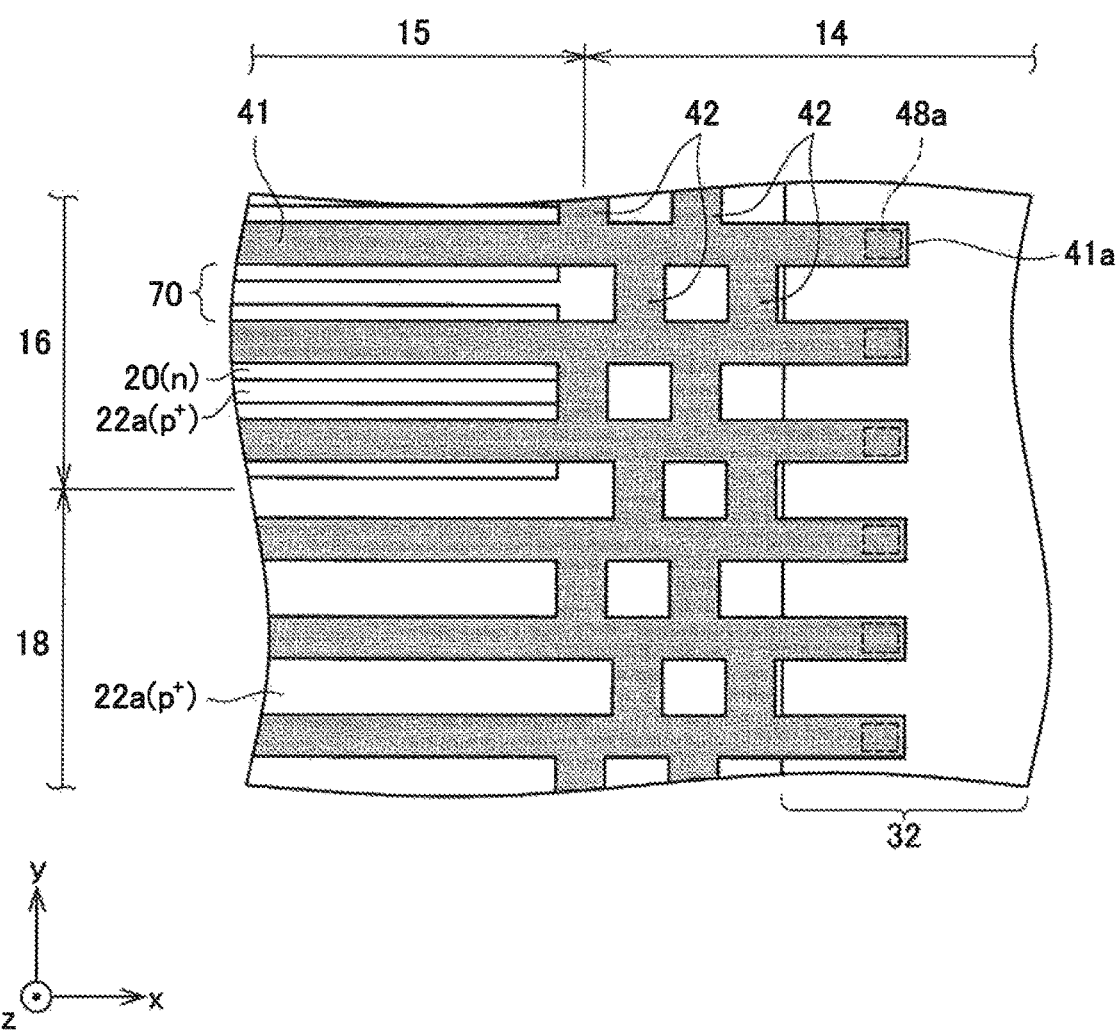
FIG. 7 is a plan view of a semiconductor device in a third modified example that corresponds to FIG. 1.

In addition, in the above-described example, the single second trench 42 that extends linearly is arranged between the p-type end layer 32 and the element region 15. However, as a second modified example, as shown in FIG. 6, the second trench 42 may extend in the y-direction while changing its position in the x-direction. With such a configuration, the second trench 42 is still connected to each of the first trenches 41. Thus, the p-type end layer 32 can be separated from the upper body layer 22 and the lower body layer 26 in the element region 15. Furthermore, as a third modified example, as shown in FIG. 7, the second trench 42 may be arranged in double rows between the p-type end layer 32 and the element region 15.

Figure 8:
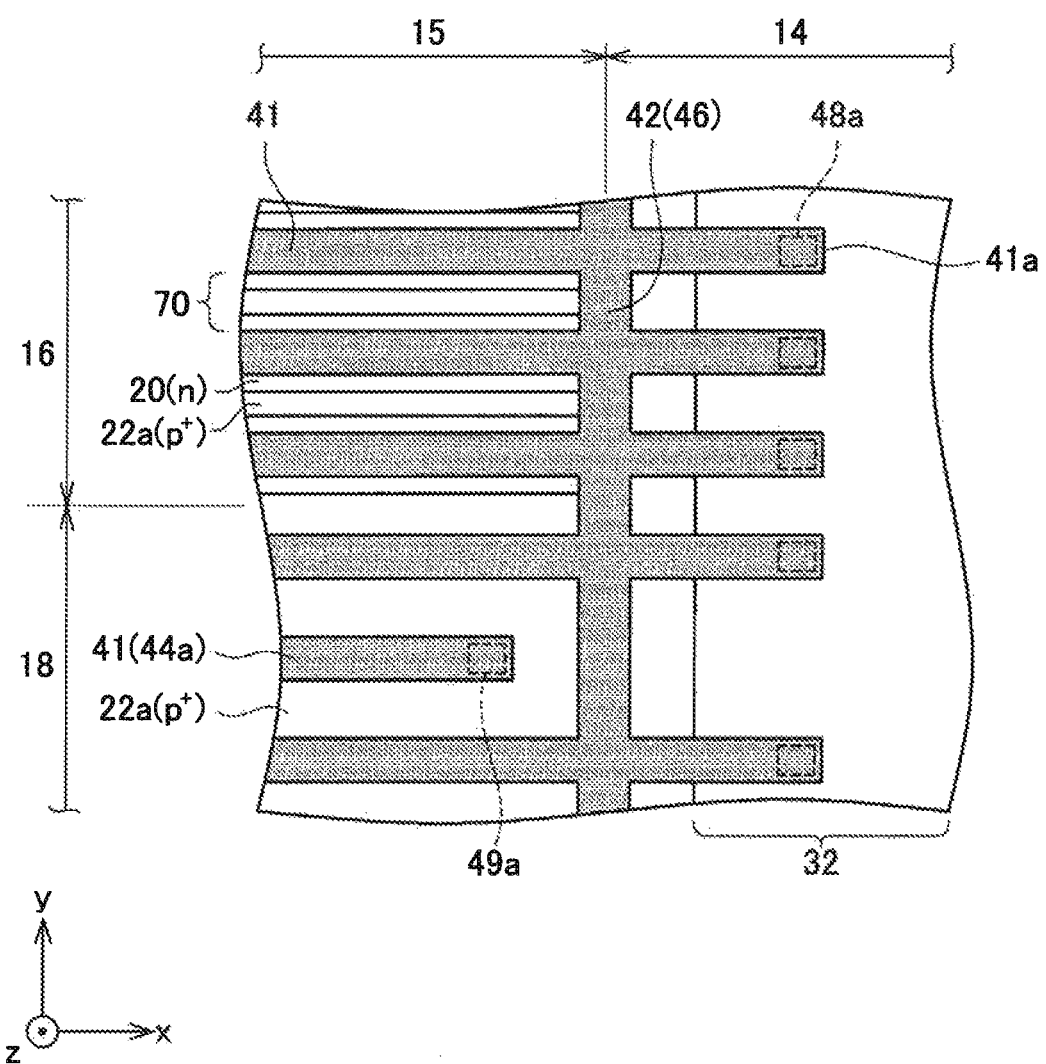
FIG. 8 is a plan view of a semiconductor device in a fourth modified example that corresponds to FIG. 1.

In addition, in the above-described example, all of the trench electrodes 44 in the diode region 18 are connected to the trench electrodes 44 in the IGBT region 16 via the trench electrode 46 in the second trench 42 and the gate line 62. However, as a fourth modified example, as shown in FIG. 8, some trench electrodes 44a in the diode region 18 may be separated from the trench electrode 46 in the second trench 42 and may be connected to the upper electrode 60 via a contact hole 49a. In this case, a potential of the trench electrode 44a is fixed at the same potential as the upper electrode 60. The trench electrodes 44 in the diode region 18 do not contribute to switching of the IGBT. Thus, there would be no problem even when some of the trench electrodes 44a are connected to the fixed potential. In addition, when some of the trench electrodes 44a in the diode region 18 are cut off from the trench electrodes 44 (the gate electrode of the IGBT) in the IGBT region 16, just as described, gate capacitance of the IGBT can be lowered. In this way, a switching speed of the IGBT can be improved. Furthermore, the trench electrodes 44 in the diode region 18 may electrically be separated from the trench electrodes 44 in the IGBT region 16, and the potential of the trench electrode 44 in the diode region 18 may be controllable independently from the potential of the trench electrodes 44 in the IGBT region 16.

Figure 9:
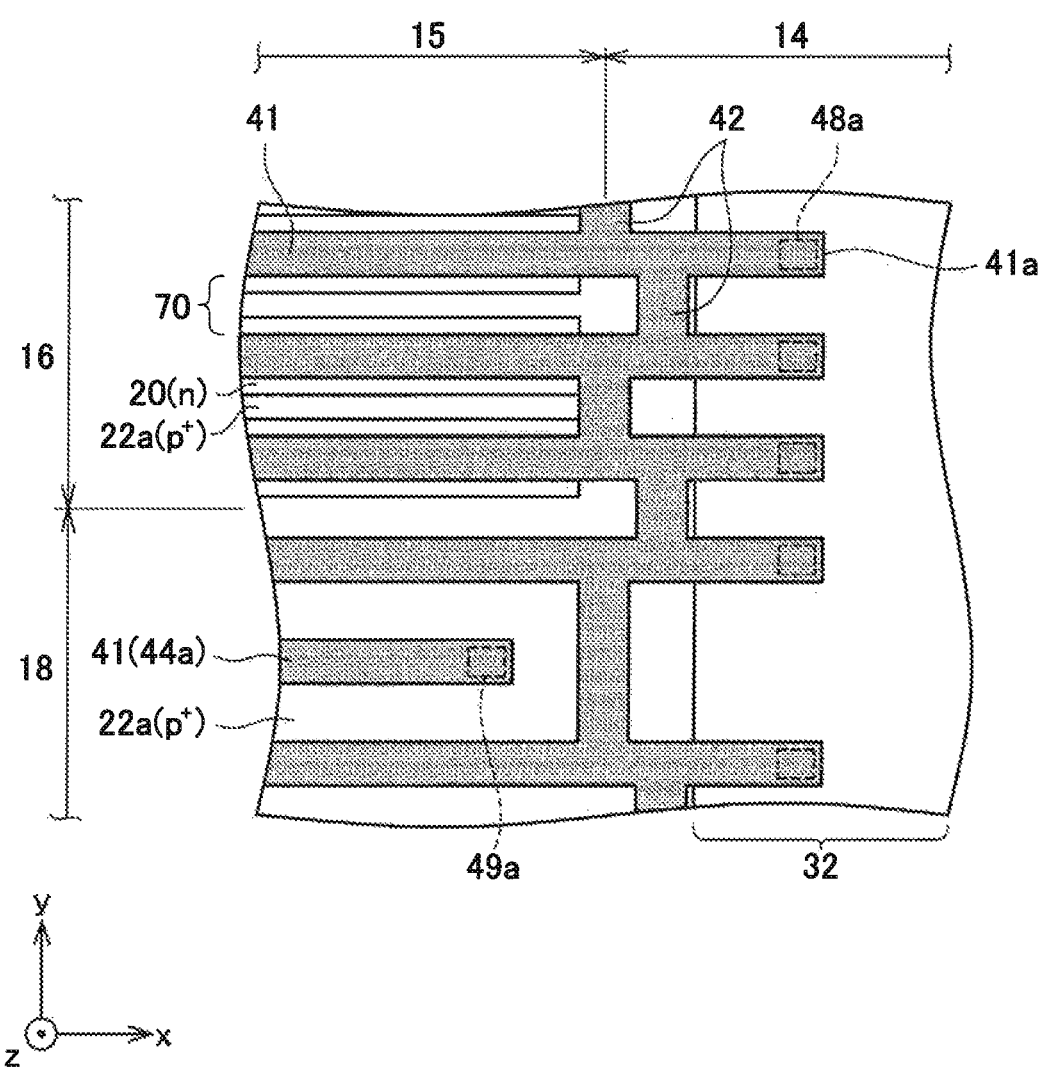
FIG. 9 is a plan view of a semiconductor device in a fifth modified example that corresponds to FIG. 1.
Figure 10:
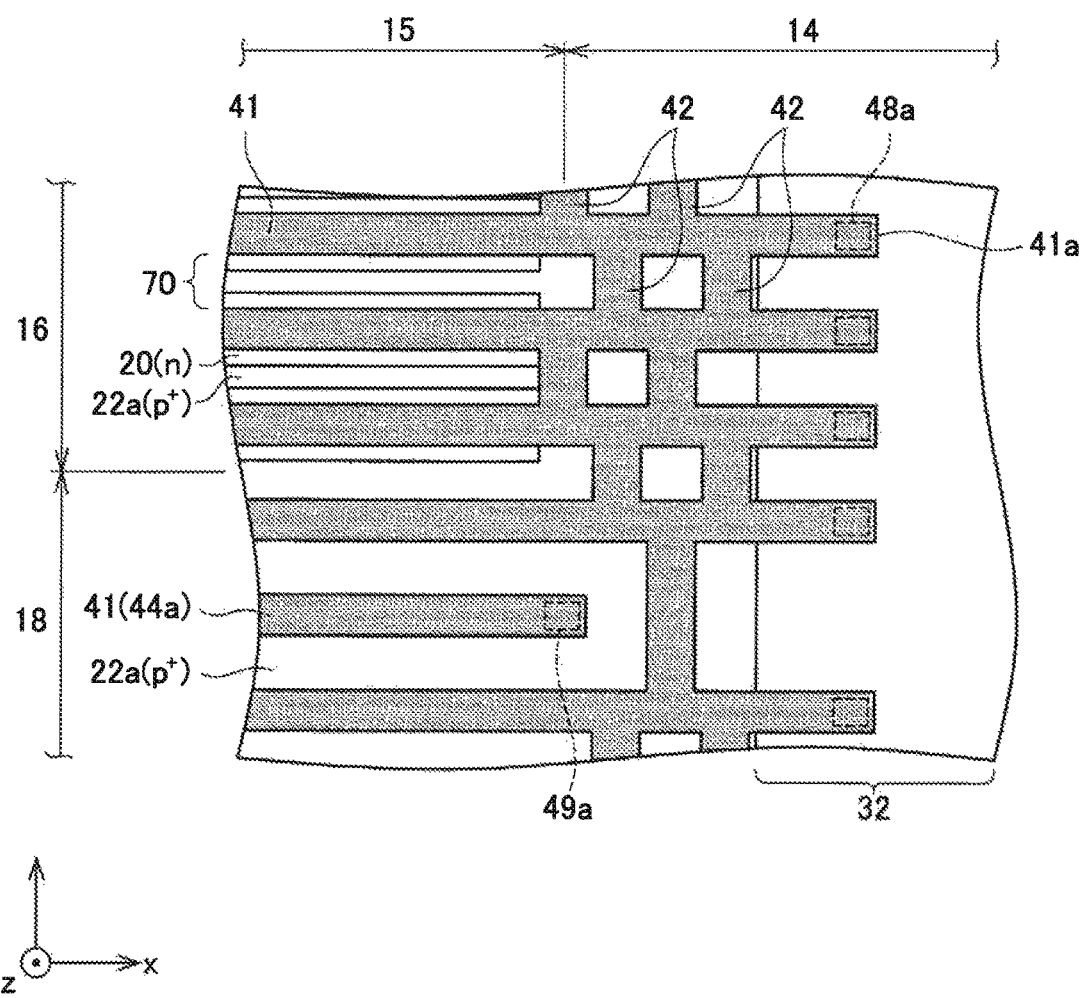
FIG. 10 is a plan view of a semiconductor device in a sixth modified example that corresponds to FIG. 1.

As a fifth modified example, when the trench electrodes 44a are connected to the upper electrode 60, the second trench 42 may be configured by being shifted in the x-direction as shown in FIG. 9. As a sixth modified example, when the trench electrodes 44a are connected to the upper electrode 60, the second trench 42 may be provided double as shown in FIG. 10.

Figure 11:
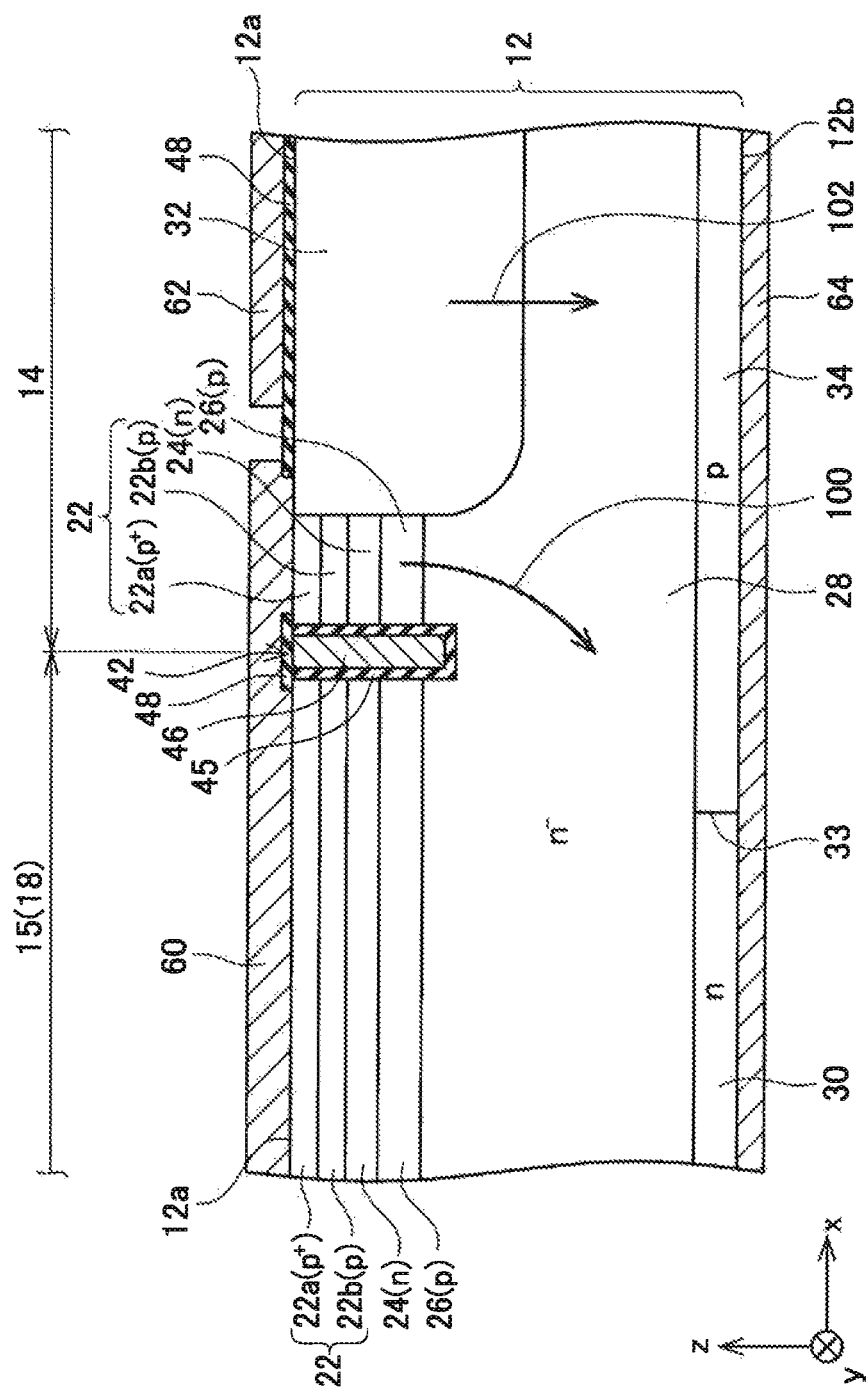
FIG. 11 is a vertical cross-sectional view of a semiconductor device in a seventh modified example that corresponds to FIG. 3.

In the above-described example, as shown in FIG. 3, the interface 33 between the cathode layer 30 and the second collector layer 34 is arranged below the second trench 42. However, as a seventh modified example, as shown in FIG. 11, the interface 33 may be arranged in the diode region 18. With this configuration, the p-type second collector layer 34 is arranged in the entire range of the peripheral region 14 that is exposed to the lower surface 12b. Thus, inflow of the holes indicated by an arrow 102 (inflow of the holes from the p-type end layer 32 into the drift layer 28) can be suppressed.

Figure 12:
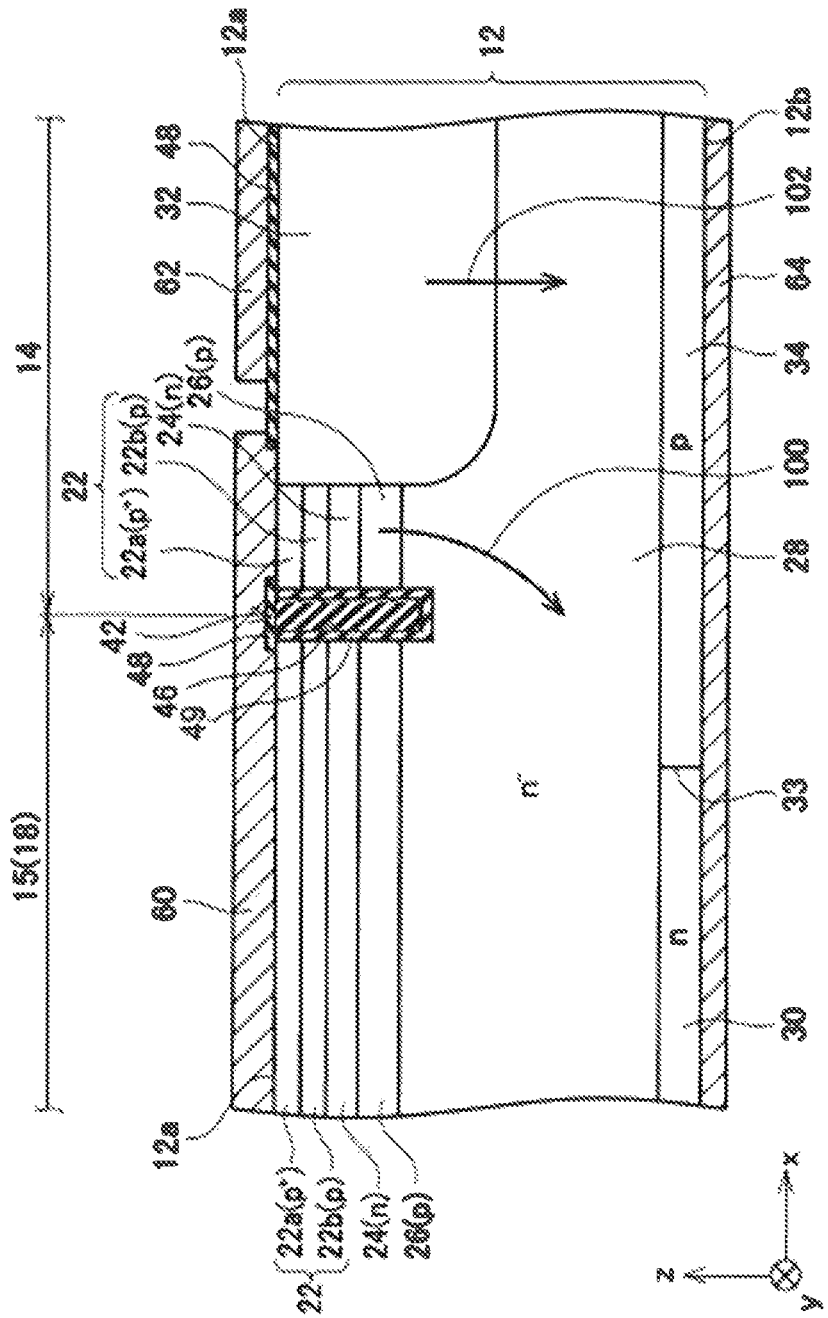
FIG. 12 is a vertical cross-sectional view of a semiconductor device in an eighth modified example that corresponds to FIG. 3.

In addition, in the above-described example, the trench electrode 46 is arranged in the second trench 42. However, as an eighth modified example, as shown in FIG. 12, the trench electrode 46 may not be arranged in the second trench 42, and the inside of the second trench 42 may entirely be filled with an insulating body 49. With such a configuration, the p-type end layer 32 can be separated from the upper body layer 22 and the lower body layer 26 in the element region 15.

Figure 13:
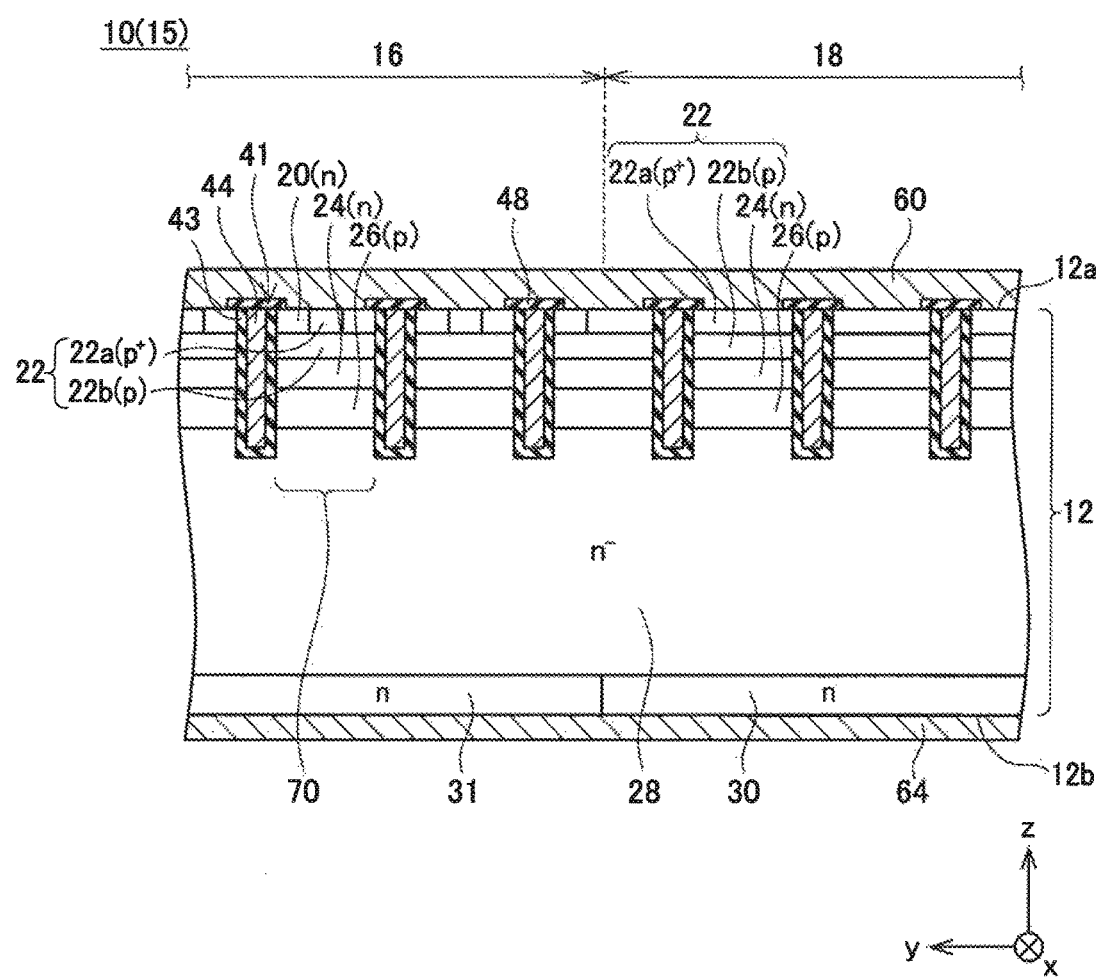
FIG. 13 is a vertical cross-sectional view of a semiconductor device in a ninth modified example that corresponds to FIG. 2.

In addition, in the above-described example, the semiconductor substrate includes the diode region and the IGBT region. However, instead of the IGBT region, the semiconductor substrate may include a region that is formed of a transistor other than the IGBT. For example, as a ninth modified example, as shown in FIG. 13, the semiconductor substrate may have the diode region and a metal-oxide-semiconductor field effect transistor (MOS-FET) region.

Technical elements disclosed in this specification will be listed below. Note that each of the following technical elements is independently useful.

In one example of the configuration disclosed in this specification, the semiconductor substrate includes the diode region and the IGBT region. The plural inter-trench regions exist. Each of the diode region and the IGBT region has at least one inter-trench region. The inter-trench region in the IGBT region contacts the upper electrode and the first insulating layer and has the n-type emitter layer that is separated from the barrier layer by the first p-type layer. The inter-trench region in the diode region does not have the emitter layer. The cathode layer is arranged in the diode region. The semiconductor substrate is arranged in the IGBT region, is arranged below the drift layer, and has the p-type first collector layer that contacts the lower electrode.

Note that the cathode layer may be arranged in at least a part of the diode region and the first collector layer may be arranged in at least a part of the IGBT region.

With such a configuration, the diode is formed in the diode region, and the IGBT is formed in the IGBT region. In other words, the semiconductor device can be operated as the RC-IGBT.

In the example of the configuration disclosed in this specification, a part of the drift layer is arranged below the p-type end layer. The semiconductor substrate has the p-type second collector layer which is arranged on the lower side of the drift layer at the position below the p-type end layer and contacts the lower electrode. The boundary between the cathode layer and the second collector layer is arranged below the second trench or in the diode region. That is, when the semiconductor substrate is seen in the plan view, the boundary between the cathode layer and the second collector layer is located on the second trench or on the opposite side of the p-type end layer across the second trench in the longitudinal direction of the first trench.

With this structure, a downward flow (that is, a flow toward the second collector layer) of the holes from the p-type end layer is prevented. Thus, the holes are less likely to flow from the p-type end layer into the drift layer. Therefore, the reverse recovery loss can further be suppressed.

In the example of the configuration disclosed in this specification, the p-type end layer contacts the lateral surface on the p-type end layer side of the second trench.

With this configuration, the reverse recovery loss can be further suppressed.

In the configuration of the example disclosed in this specification, the p-type impurity concentration of the p-type end layer is higher than the n-type impurity concentration of the drift layer.

With this configuration, the concentration of the electric field around the longitudinal end of the first trench can be further effectively suppressed.

The embodiment has been described in detail so far. However, this is merely illustrative and thus does not limit the technique disclosed in this specification. The technique disclosed in this specification includes various modifications and changes made to the example that has been exemplified so far. Technical elements that are described in this specification and the drawings demonstrate technical utility when used singly or in various combinations, and thus are not limited to the combinations described in the claims in the original application. In addition, the techniques that are illustrated in this specification and the drawings can achieve a plurality of purposes simultaneously and demonstrate the technical utility by achieving one purpose thereof itself.

What is claimed is:

1. A semiconductor device comprising:
   a semiconductor substrate that includes, on a first surface, a plurality of first trenches and a second trench linked to each of the first trenches;
   first insulating layers covering an inner surface of each of the first trenches;
   first trench electrodes respectively provided in the first trenches and insulated from the semiconductor substrate by the first insulating layers;
   a second insulating layer covering an inner surface of the second trench;
   a first electrode provided on the first surface; and
   a second electrode provided on a second surface of the semiconductor substrate, wherein the semiconductor substrate includes:
   a p-type end layer extending from the first surface to a position closer to the second surface than an end of each of the first trenches on a second surface side in a thickness direction of the semiconductor substrate and including a longitudinal end of each of the first trenches in a plan view of the first surface;
   a first p-type layer provided on an opposite side of the p-type end layer across the second trench, the first p-type layer being provided in an inter-trench region that is held between adjacent first trenches, and contacting the first electrode;
   an n-type barrier layer, the n-type barrier layer being provided in the inter-trench region and being provided closer to the second surface than the first p-type layer;
   a second p-type layer provided in the inter-trench region, the second p-type layer being provided closer to the second surface than the n-type barrier layer, and being separated from the first p-type layer by the n-type barrier layer;
   an n-type drift layer, the n-type drift layer being provided closer to the second surface than the second p-type layer; and
   an n-type cathode layer, the n-type cathode layer being provided closer to the second surface than the n-type drift layer and contacting the n-type drift layer and the second electrode, and
   the second trench separates the p-type end layer from the first p-type layer and the second p-type layer.

2. The semiconductor device according to claim 1, wherein
   the semiconductor substrate includes a diode region and an insulated gate bipolar transistor region,
   a plurality of the inter-trench regions exist,
   each of the diode region and the insulated gate bipolar transistor region has at least one of the inter-trench regions,
   the inter-trench region in the insulated gate bipolar transistor region has an n-type emitter layer, the n-type emitter layer contacting the first electrode and the first insulating layer and being separated from the n-type barrier layer by the first p-type layer,
   the n-type cathode layer is provided in the diode region, and
   the semiconductor substrate has a p-type first collector layer, the p-type first collector layer being provided in the insulated gate bipolar transistor region, provided closer to the second surface than the n-type drift layer, and contacting the n-type drift layer and the second electrode.

3. The semiconductor device according to claim 2, wherein
the diode region is a region that has the n-type cathode layer between the n-type drift layer and the second electrode, and
the insulated gate bipolar transistor region is a region that has the p-type first collector layer between the n-type drift layer and the second electrode.

4. The semiconductor device according to claim 3, wherein
the diode region includes the inter-trench region that is not provided with the n-type emitter layer.

5. The semiconductor device according to claim 2, wherein
a part of the n-type drift layer is provided closer to the second surface than the p-type end layer,
the semiconductor substrate has a p-type second collector layer, the p-type second collector layer being provided closer to the second surface than the p-type end layer and closer to the second surface than the n-type drift layer, and contacting the n-type drift layer and the second electrode, and
a boundary between the n-type cathode layer and the p-type second collector layer is provided at a position that overlaps the second trench or in the diode region when the semiconductor substrate is seen in the plan view.

6. The semiconductor device according to claim 1, wherein
the p-type end layer contacts a lateral surface of the second trench on a p-type end layer side.

7. The semiconductor device according to claim 6, wherein
the p-type end layer contacts an entire range of the lateral surface of the second trench on the p-type end layer side.

8. The semiconductor device according to claim 1, wherein
p-type impurity concentration of the p-type end layer is higher than n-type impurity concentration of the n-type drift layer.

9. The semiconductor device according to claim 1, wherein
the first trenches extend in parallel with each other when the semiconductor substrate is seen in the plan view.

10. The semiconductor device according to claim 9, wherein
the second trench extends in an orthogonal direction to the first trenches when the semiconductor substrate is seen in the plan view.

11. The semiconductor device according to claim 1, wherein
the second trench is filled with an insulating body.

12. The semiconductor device according to claim 2, wherein
the second trench is provided with a second trench electrode, and
each of the first trench electrodes is electrically connected via the second trench electrode.

13. The semiconductor device according to claim 12, wherein
one of the first trench electrodes in the diode region is electrically separated from the second trench electrode and contacts the first electrode.

14. The semiconductor device according to claim 2, wherein
the first trench electrode in the diode region is electrically separated from the first trench electrode in the insulated gate bipolar transistor region.

15. The semiconductor device according to claim 10, wherein
a plurality of the inter-trench regions exist,
a second trench in a first inter-trench region as one of the inter-trench regions and a second trench in a second inter-trench region that is adjacent to the first inter-trench region are located at different positions in a longitudinal direction of the first trench.

16. The semiconductor device according to claim 10, wherein
the semiconductor substrate includes, on the first surface, two second trenches provided in parallel in a longitudinal direction of the first trench.

17. The semiconductor device according to claim 1, wherein
the semiconductor substrate includes a diode region and a metal-oxide-semiconductor field effect transistor region,
a plurality of the inter-trench regions exist,
each of the diode region and the metal-oxide-semiconductor field effect transistor region has at least one of the inter-trench regions,
the inter-trench region in the metal-oxide-semiconductor field effect transistor region has an n-type source layer, the n-type source layer contacting the first electrode and the first insulating layer and being separated from the n-type barrier layer by the first p-type layer,
the n-type cathode layer is provided in the diode region, and
the semiconductor substrate has an n-type drain layer, the n-type drain layer being provided in the metal-oxide-semiconductor field effect transistor region, being provided closer to the second surface than the n-type drift layer, and contacting the n-type drift layer and the second electrode.

18. The semiconductor device according to claim 1, wherein
the n-type cathode layer has higher n-type impurity concentration than the n-type drift layer.

* * * * *